United States Patent
Low et al.

(10) Patent No.: US 6,692,610 B2
(45) Date of Patent: Feb. 17, 2004

(54) OLED PACKAGING

(75) Inventors: Hong Yee Low, Selangor (MY); Soo Jin Chua, Singapore (SG); Ewald Karl Michael Guenther, Singapore (SG)

(73) Assignee: Osram Opto Semiconductors GmbH, Regensburg (DE)

( * ) Notice: Subject to any disclaimer, the term of this patent is extended or adjusted under 35 U.S.C. 154(b) by 190 days.

(21) Appl. No.: 09/915,803

(22) Filed: Jul. 26, 2001

(65) Prior Publication Data

US 2003/0019572 A1 Jan. 30, 2003

(51) Int. Cl.$^7$ ................................................. B32B 31/28
(52) U.S. Cl. ................. 156/273.5; 156/275.5; 156/275.7
(58) Field of Search .................. 156/272.2, 273.3, 156/273.5, 275.5, 275.7; 313/512; 257/99, 100, 704; 345/82

(56) References Cited

U.S. PATENT DOCUMENTS

| | | | | |
|---|---|---|---|---|
| 5,117,279 A | * | 5/1992 | Karpman | 257/793 |
| 6,271,579 B1 | * | 8/2001 | Going et al. | 257/664 |
| 6,470,594 B1 | * | 10/2002 | Boroson et al. | 34/335 |
| 6,537,688 B2 | * | 3/2003 | Silvernail et al. | 428/690 |

* cited by examiner

Primary Examiner—Michael W. Ball
Assistant Examiner—John T. Haran
(74) Attorney, Agent, or Firm—Dexter Chin

(57) ABSTRACT

An improved method of fabricating a device such as OLED is disclosed. The method includes applying an adhesive on a cap or substrate. The adhesive is partially cured to initiate the cross-linking process while remaining in the liquid phase. The cap is then mounted onto the substrate and the adhesive is cured to encapsulate the device. By partially curing the adhesive prior to mounting the cap, the curing of the adhesive can be achieved without prolonged exposure to UV radiation or high temperatures which can adversely impact the device.

16 Claims, 4 Drawing Sheets

OLED PACKAGING

FIELD OF THE INVENTION

The present invention relates to fabrication of devices such as organic light emitting diodes (OLEDs). More particularly, the invention relates to a process for encapsulating or packaging OLEDs.

BACKGROUND OF THE INVENTION

FIG. 1 shows a conventional OLED device 100. The OLED device comprises one or more organic functional layers 110 between first and second electrodes 105 and 115 formed on a thin substrate 101. For flexible devices, the substrate material typically comprises plastic or polymer, such as PET, PEN, PC, or PES. The electrodes can be patterned to form, for example, a plurality of OLED cells to create an OLED device (e.g., pixelated device, segmented display, or larger area illumination source). Bond pads 150, which are coupled to the first and second electrodes, are provided to enable electrical connections to the OLED cells. A cap 160 encapsulates the device to protect the OLED cells from the environment such as moisture and/or air.

Typically, the cap is bonded to the substrate with active OLED cells using polymeric resin based adhesives. After mounting the cap onto the substrate, the adhesive is cured. Curing is preferably done by UV instead of heat due to the low thermal stability of the active layers of the OLED device. Current UV processes are ineffective with plastic substrates since the substrates filter about 40–60% of the UV radiation, resulting in incomplete curing of the adhesives. To ensure that the adhesive is fully cured, the substrate is subjected to prolonged UV exposure. However, prolonged exposure to UV undesirably cause the substrates to become brittle and yellow.

As evidenced from the above discussion, it is desirable to provide a process which effectively encapsulates the device without affecting the quality and characteristics of the substrate of active components.

SUMMARY OF THE INVENTION

The invention relates to fabricating device which includes encapsulating the active components of the device with a cap. In one embodiment, the components comprise OLEDs. An adhesive is applied to the cap in regions which contact the substrate on which the active device is formed. Providing the adhesive on the substrate in regions contacting the cap is also useful. In accordance with the invention, the adhesive is partially cured to initiate the cross-linking process while remaining in a liquid phase. In one embodiment, the pre-cure comprises exposing the adhesive to radiation for less or equal to about 30 seconds. After partially curing the adhesive, the cap is mounted onto the substrate. The adhesive is then fully cured, thereby encapsulating the device. The partial curing of the adhesive prior to mounting the cap advantageously enables curing to seal the device without the need of strong curing conditions (high temperatures or prolonged UV exposure).

PREFERRED EMBODIMENTS OF THE INVENTION

Figure 1:
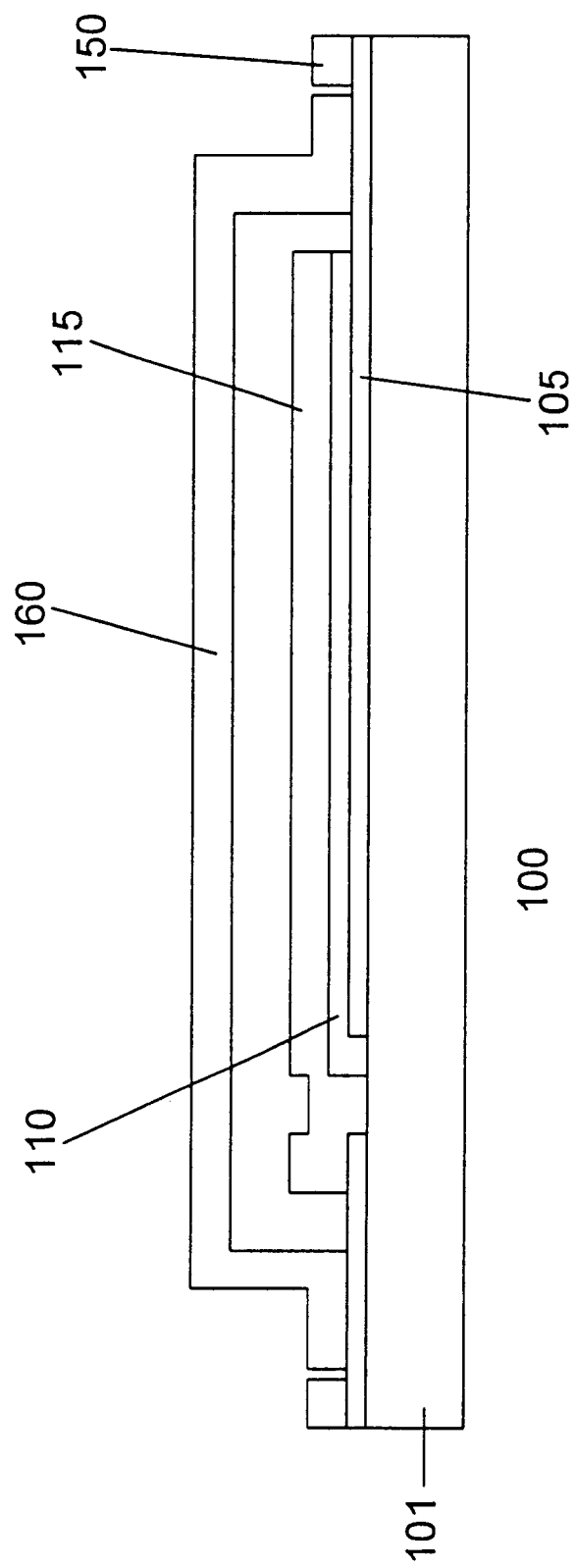
FIG. 1 shows an OLED device.
Figure 2:
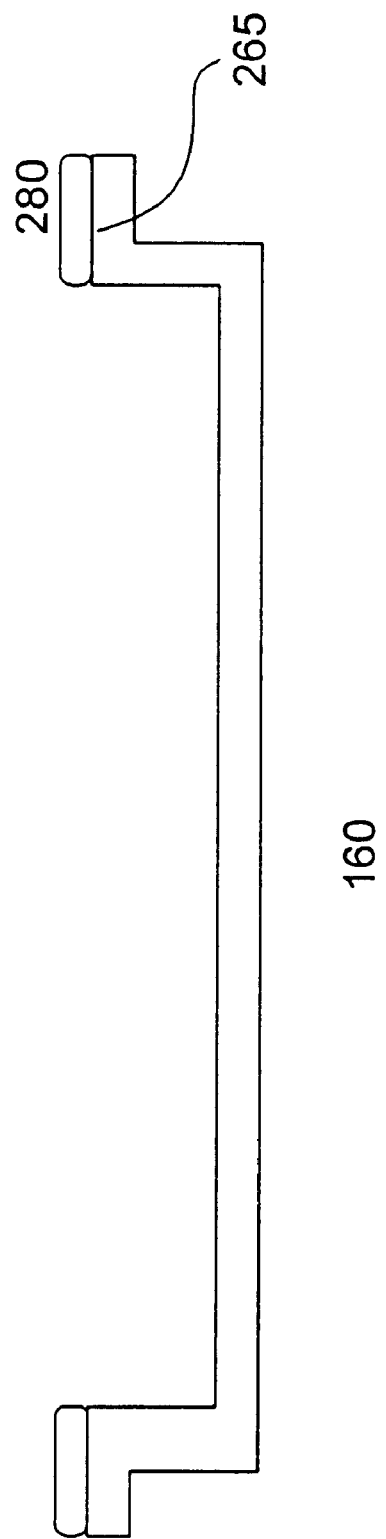
FIGS. 2–4 show a process for fabricating a device in accordance with the invention.
Figure 3:
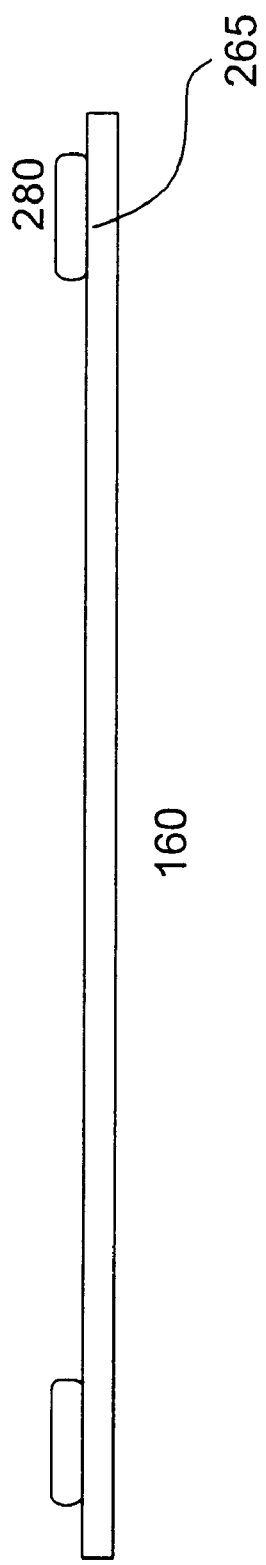

FIGS. 2–3 show a process for encapsulating an OLED device in accordance with one embodiment of the invention. Referring to FIG. 2, a cap 160 is shown. In one embodiment, the cap comprises a cavity cap. When mounted on the substrate on which the device is formed, a cavity is created to accommodate, for example, the OLED cells. Alternatively, the cap can comprise a flat substrate, as shown in FIG. 3. In such applications, the substrate on which the cap is mounted can be prepared with support structures to create the cavity. Such support structures are described in, for example, PCT Application No: PCT/SG/00143 filed on Dec. 17 1999, titled "Encapsulation For Organic LED Device" (Attorney Docket Number 99P 8271), which are herein incorporated by reference for all purposes. The cap comprises, for example, metal or glass. Other materials, such as polymers (e.g., PET, PC, PES, PEN, PE, PMMAS, PS), are also useful.

An adhesive 280 is applied to portions 265 of the cap which contacts the substrate. Various techniques, such as dispensing, screen printing and contact printing, can be used to apply the adhesive. The adhesive comprises, for example, polymeric resin based adhesives such as epoxy or acrylic resins. Other types of adhesives, such as phenolic or bismaleimide, are also useful. Applying the adhesive to the substrate in regions which contact the cap is also useful.

In accordance with the invention, the adhesive is partially cured prior to mounting the cap onto the substrate. In one embodiment, the adhesive partially cured by exposing it to UV radiation. In one embodiment, the adhesive is directly exposed to UV radiation for about 30 seconds. The pre-curing initiates the cross-linking process in the adhesive but does not harden it. In other words, the adhesive remains as a viscous liquid and not a gel after the partial curing process. Other partial curing techniques, such as e-beam, laser, or heat can be used. The curing techniques and conditions may depend of the type of adhesive used.

Figure 4:
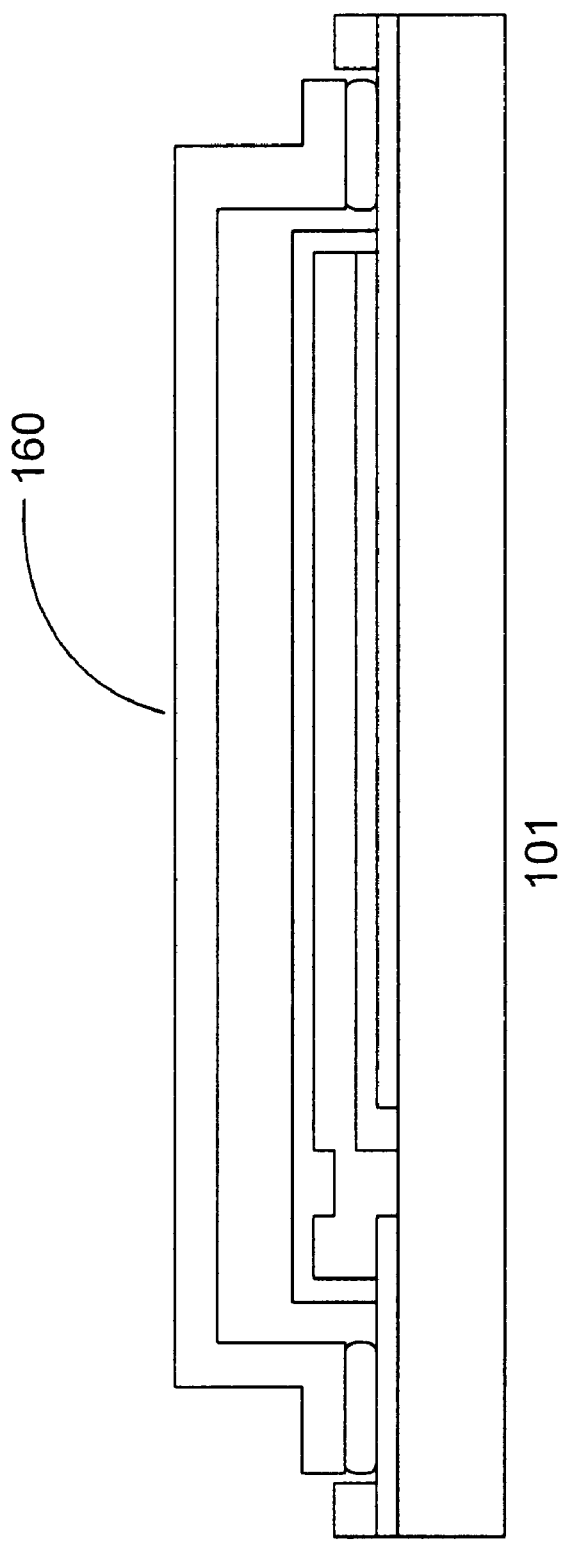

Referring to FIG. 4, a substrate 101 is provided. The substrate comprises, for example, plastic or polymeric material. Plastic or polymeric materials are particularly useful for fabricating flexible devices. Such materials include, for example, poly(ethylene terephthalate) (PET), poly(butylene terephthalate) (PBT), poly(enthylene naphthalate) (PEN), Polycarbonate (PC), polyimides (PI), polysulfones (PSO), poly(p-phenylene ether sulfone) (PES), polyethylene (PE), polypropylene (PP), poly(vinyl chloride) (PVC), polystyrene (PS) and poly(methyl methyleacrylate) (PMMA). Other materials which can serve as a substrate are also useful.

In one embodiment, the substrate is processed to include OLED cells in the active area on a surface thereof. The cap 160 is mounted on the substrate 101. The device is then subjected to a final curing process to complete the curing of the adhesive. In one embodiment, the final curing process comprises thermal curing. The thermal curing, in one embodiment, is performed at a temperature in which the active organic layers remain stable. In one embodiment, the adhesive is cured at about 65° C. or less for about 60 minutes or less. The curing encapsulates the OLED device, hermetically sealing the active components. Thus, by partially curing the adhesive in accordance with the invention, the device can be encapsulated without prolonged exposure to high temperatures or UV radiation which can adversely affect the device.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method for fabricating a device comprising:
   providing a substrate having active components of the device fabricated thereon;
   providing a cap used to encapsulate the active components on the substrate;
   applying an adhesive in regions of the can which contact the substrate or in regions of the substrate which contacts the cap;
   partially caring the adhesive, wherein the partial curing initiates cross-linking in the adhesive while remaining in liquid phase, the partial curing comprises exposing the adhesive to UV radiation;
   mounting the cap onto the substrate; and
   curing the partially cured adhesive to encapsulate the device, wherein the curing comprises thermal curing.

2. The method as recited in claim 1 wherein the thermal curing is at a temperature of less than or equal to about 65° C. for less than or equal to 60 minutes.

3. The method as recited in claim 2 wherein the partial curing comprises exposing the adhesive to by radiation for less than about 30 seconds.

4. The method as recited in claim 1 wherein the partial curing comprises exposing the adhesive to by radiation for less than about 30 seconds.

5. The method as recited in claim 1, 2, 3 or 4 wherein the active components comprise OLEDs (organic light emitting diodes).

6. The method as recited in claim 5 wherein the adhesive comprises epoxy or acrylic resins.

7. The method as recited in claim 6 wherein the substrate comprises a polymeric material.

8. The method as recited in claim 6 wherein the device comprises a flexible device.

9. The method as recited in claim 8 wherein the substrate comprises a polymeric material.

10. The method as recited in claim 5 wherein the device comprises a flexible device.

11. The method as recited in claim 10 wherein the substrate comprises a polymeric material.

12. The method as recited in claim 5 wherein the substrate comprises a polymeric material.

13. The method as recited in claim 1, 2, 3 or 4 wherein the adhesive comprises epoxy or acrylic resins.

14. The method as recited in claim 13 wherein the substrate comprises a polymeric material.

15. The method as recited in claim 13 wherein the device comprises a flexible device.

16. The method as recited in claim 15 wherein the substrate comprises a polymeric material.

* * * * *

UNITED STATES PATENT AND TRADEMARK OFFICE
CERTIFICATE OF CORRECTION

| | | |
|---|---|---|
| PATENT NO. | : 6,692,610 B2 | Page 1 of 1 |
| APPLICATION NO. | : 09/915803 | |
| DATED | : February 17, 2004 | |
| INVENTOR(S) | : Hong Yee Low, Soo Jin Chua and Ewald Karl Michael Guenther | |

It is certified that error appears in the above-identified patent and that said Letters Patent is hereby corrected as shown below:

Column 3, line 9, claim 1, "can" should read -- cap --;
line 12, claim 1, "caring" should read -- curing --;
line 23, claim 3, "by" should read -- UV --;
line 26, claim 4, "by" should read -- UV --.

Signed and Sealed this

First Day of May, 2007

JON W. DUDAS
*Director of the United States Patent and Trademark Office*